United States Patent
Morita et al.

(10) Patent No.: US 12,009,175 B2
(45) Date of Patent: Jun. 11, 2024

(54) CHARGED PARTICLE BEAM WRITING APPARATUS

(71) Applicant: NuFlare Technology, Inc., Yokohama (JP)

(72) Inventors: Hirofumi Morita, Setagaya-ku (JP); Takanao Touya, Kawasaki (JP)

(73) Assignee: NuFlare Technology, Inc., Yokohama (JP)

( * ) Notice: Subject to any disclaimer, the term of this patent is extended or adjusted under 35 U.S.C. 154(b) by 79 days.

(21) Appl. No.: 17/655,876

(22) Filed: Mar. 22, 2022

(65) Prior Publication Data
US 2022/0328278 A1 Oct. 13, 2022

(30) Foreign Application Priority Data

Apr. 13, 2021 (JP) .................................. 2021-067803

(51) Int. Cl.
*H01J 37/12* (2006.01)
*H01J 37/147* (2006.01)
*H01J 37/317* (2006.01)

(52) U.S. Cl.
CPC .............. *H01J 37/147* (2013.01); *H01J 37/12* (2013.01); *H01J 37/3174* (2013.01)

(58) Field of Classification Search
None
See application file for complete search history.

(56) References Cited

U.S. PATENT DOCUMENTS

| | | | | |
|---|---|---|---|---|
| 5,872,358 A | * | 2/1999 | Todokoro | H01J 37/28 250/397 |
| 7,223,983 B2 | * | 5/2007 | Kawasaki | H01J 37/1478 250/398 |
| 7,355,174 B2 | * | 4/2008 | Sato | H01J 37/265 250/306 |
| 10,770,262 B1 | * | 9/2020 | Chandler | H01J 37/06 |
| 10,777,382 B2 | | 9/2020 | Li et al. | |

(Continued)

FOREIGN PATENT DOCUMENTS

CN 109300759 B 7/2020
JP 2001-357808 A 12/2001
(Continued)

OTHER PUBLICATIONS

Hirofumi Morita et al., "Basic Characteristics of Beam Position Drift and Field Stitching Error Caused by Electron Beam Column Charging", Japanese Journal of Applied Physics vol. 35(1996), Part 1, No. 7, Jul. 1996, pp. 4121•4127.

(Continued)

*Primary Examiner* — Sean M Luck
(74) *Attorney, Agent, or Firm* — Oblon, McClelland, Maier & Neustadt, L.L.P.

(57) ABSTRACT

In one embodiment, a charged particle beam writing apparatus includes a positioning deflector adjusting an irradiation position of a charged particle beam radiated to a substrate which is a writing target, a fixed deflector which is disposed downstream of the positioning deflector in a traveling direction of the charged particle beam, and in which an amount of deflection is fixed, a focus correction lens performing focus correction on the charged particle beam according to a surface height of the substrate, and an object lens focusing the charged particle beam.

13 Claims, 7 Drawing Sheets

(56) References Cited

U.S. PATENT DOCUMENTS

| | | |
|---|---|---|
| 11,075,056 B2 | 7/2021 | Li et al. |
| 2004/0089805 A1 | 5/2004 | Todokoro et al. |
| 2004/0119023 A1* | 6/2004 | Nakasuji ............... H01J 37/073 |
| | | 250/396 R |
| 2009/0218506 A1 | 9/2009 | Nakasuji et al. |
| 2013/0216953 A1 | 8/2013 | Touya et al. |
| 2016/0217967 A1* | 7/2016 | Dohi ....................... H01J 37/28 |
| 2017/0221672 A1* | 8/2017 | Kuroda ................. H01J 37/147 |
| 2018/0284620 A1 | 10/2018 | Ogasawara |
| 2019/0371565 A1 | 12/2019 | Touya et al. |

FOREIGN PATENT DOCUMENTS

| | | |
|---|---|---|
| JP | 2007-141488 A | 6/2007 |
| JP | 2013-191841 A | 9/2013 |
| JP | 2017-112263 A | 6/2017 |
| JP | 10-2019-0138583 | 12/2019 |
| JP | 2019-212766 A | 12/2019 |
| JP | 6927728 B2 | 9/2021 |
| WO | WO 99/46798 A1 | 9/1999 |

OTHER PUBLICATIONS

Junichi Kato et al., "Beam position stabilization by suppression of electrons reentering the electron-beam column", Journal of Vacuum Science & Technology B 13(6), Nov./Dec. 1995, pp. 2450-2454.
Combined Taiwanese Office Action and Search Report dated Mar. 23, 2023 in Taiwanese Patent Application No. 111110002 (with unedited computer-generated English translation), 8 pages.
Korean Office Action dated Mar. 18. 2024, Issued in Korean Patent Application No. 10-2022-0041996 (with English translation).

* cited by examiner

FIG.12A
FIG.12B
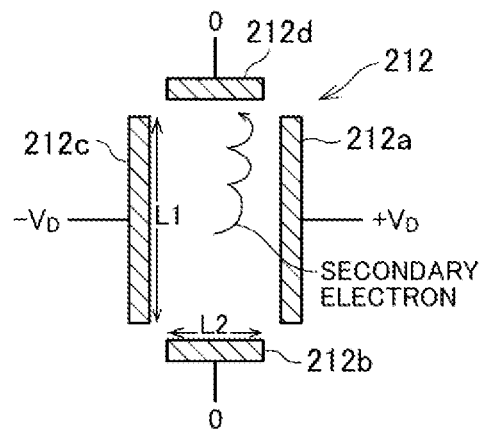
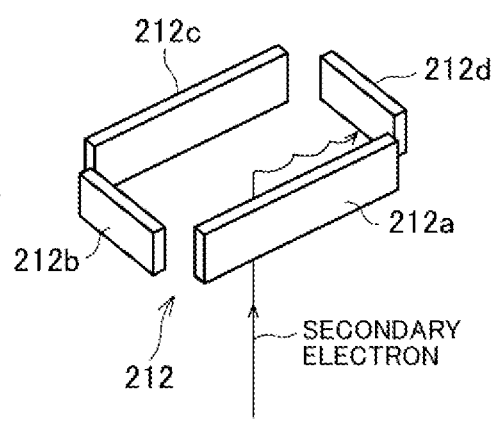
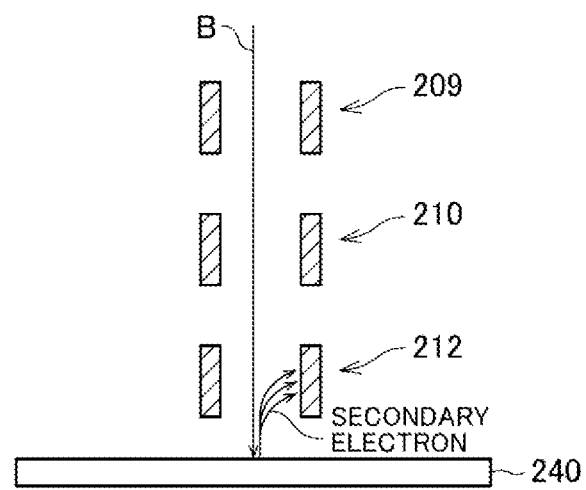
FIG.13
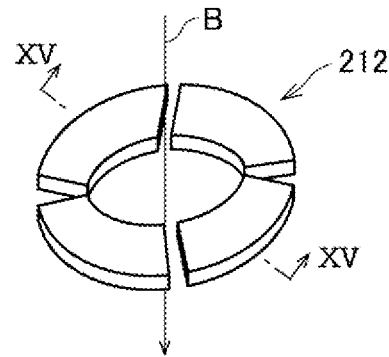
FIG.14

CHARGED PARTICLE BEAM WRITING APPARATUS

CROSS REFERENCE TO RELATED APPLICATION

This application is based upon and claims benefit of priority from the Japanese Patent Application No. 2021-67803, filed on Apr. 13, 2021, the entire contents of which are incorporated herein by reference.

FIELD

The present invention relates to a charged particle beam writing apparatus.

BACKGROUND

As LSI circuits are increasing in density, the required linewidths of circuits included in semiconductor devices become finer year by year. To form a desired circuit pattern on a semiconductor device, a method is employed in which a high-precision original pattern (i.e., a mask, or also particularly called reticle, which is used in a stepper or a scanner) formed on quartz is transferred to a wafer in a reduced manner by using a reduced-projection exposure apparatus. The high-precision original pattern is written by using an electron-beam writing apparatus, in which a so-called electron-beam lithography technique is employed.

In an electron beam writing apparatus, the beam of each shot is focused on a sample surface, which is the surface of a substrate, by an object lens, and focus correction (dynamic focusing) is dynamically performed using electrostatic lenses to cope with the irregularities on the sample surface during writing. When the electrostatic lenses are operated in a negative voltage range, secondary electrons generated by electron beam writing return to the sample surface, thus the resist is electrically charged, which prevents the improvement of the position accuracy of a writing pattern.

In order to reduce the effect due to the return of the secondary electrons and the like, it is preferable to operate the electrostatic lenses in a positive voltage range with respect to the sample surface, and to guide the secondary electrons upward from the sample.

However, when the electrostatic lenses are operated in a positive voltage range, a problem arises in that the secondary electrons from the sample surface pass through the electrostatic lenses, then are suddenly decelerated, and stay in high density on the beam trajectory, or cause non-conductive dirt (contamination) on the inner surface of the electrode of a deflector to be charged, thus the electric field near the electron beam is changed to alter the trajectory of the electron beam, and the position accuracy of the beam is deteriorated.

BRIEF DESCRIPTION OF THE DRAWINGS

FIGS. 12A and 12B are each an explanatory view of the trajectory of a secondary electron.

FIG. 13 is a view illustrating a configuration in which the fixed deflector is disposed below a focus correction lens.

FIG. 14 is a view illustrating a configuration example of the fixed deflector.

DETAILED DESCRIPTION

In one embodiment, a charged particle beam writing apparatus includes a positioning deflector adjusting an irradiation position of a charged particle beam radiated to a substrate which is a writing target, a fixed deflector which is disposed downstream of the positioning deflector in a traveling direction of the charged particle beam, and in which an amount of deflection is fixed, a focus correction lens performing focus correction on the charged particle beam according to a surface height of the substrate, and an object lens focusing the charged particle beam.

Hereinafter, an embodiment of the present invention will be described with reference to the drawings.

Figure 1:
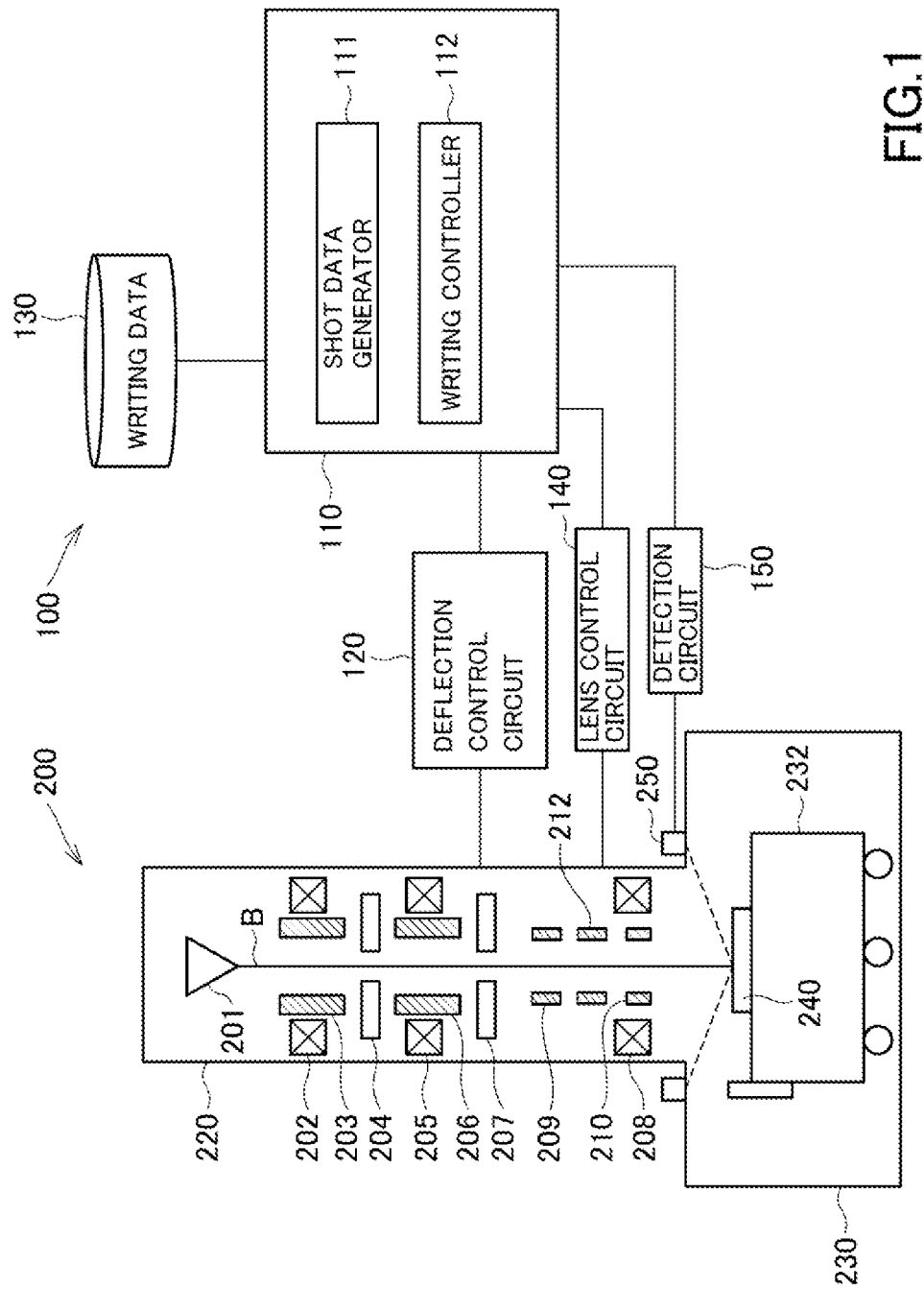
FIG. 1 is a schematic diagram of an electron beam writing apparatus according to an embodiment of the present invention.

FIG. 1 is a schematic diagram of an electron beam writing apparatus according to an embodiment of the present invention. The electron beam writing apparatus illustrated in FIG. 1 is a variable shaping writing apparatus including a controller 100 and a writer 200.

The writer 200 includes an electron optical column 220 and a writing chamber 230. In the electron optical column 220, an electron gun 201, an illuminating lens 202, a blanker 203, a first shaping aperture member 204, a projection lens 205, a shaping deflector 206, a second shaping aperture member 207, an object lens 208, a positioning deflector 209, a focus correction lens 210 and a fixed deflector 212 are disposed.

An XY stage 232 is disposed in the writing chamber 230. A substrate 240 as a writing target is placed on the XY stage 232. At an upper position of the writing chamber 230, a Z sensor 250 is disposed which detects the position of the substrate 240 in the height direction (Z-direction). The Z sensor 250 is composed of a combination of a light projector and a light receiver, and is capable of measuring the surface height of the substrate 240 by reflecting light emitted from the light projector on the surface of the substrate 240, and receiving the reflected light by the light receiver. The substrate 240 is fixed to the earth potential.

Height data detected by the Z sensor 250 is converted to digital data by a detection circuit 150, then transferred to a control calculator 110.

When an electron beam B discharged from the electron gun 201 (discharge unit) provided in the electron optical column 220 passes through the blanker (blanking deflector) 203, whether or not the electron beam is radiated to the substrate is switched by the blanker 203.

The electron beam B radiated to the entire first shaping aperture member 204 having a rectangular opening 32 (see FIG. 2) by the illuminating lens 202. The electron beam B is shaped into a rectangle by passing through the opening 32 of the first shaping aperture member 204.

The electron beam B as a first aperture image, which has passed through the first shaping aperture member 204, is projected on the second shaping aperture member 207 having a variable shaping opening 34 (see FIG. 2) by the projection lens 205. At this point, deflection control is performed by the shaping deflector 206 on the first aperture image projected on the second shaping aperture member 207, and the shape and dimensions of the electron beam which has passed through the variable shaping opening 34 can be changed (variable shaping is performed).

The electron beam B as a second aperture image, which has passed through the variable shaping opening 34 of the second shaping aperture member 207, is deflected by the positioning deflector 209, focused by the object lens 208 and the focus correction lens 210, and radiated to the substrate 240 placed on the XY stage 232 which moves continuously.

The positioning deflector 209 deflects and radiates an electron beam to a desired position, and may be a single-stage deflector or may be formed by deflectors in multiple stages with different deflection area sizes. For example, a two-stage configuration consisting of a main deflector and a sub-deflector may be adopted, or a three-stage configuration consisting of a main deflector, a sub-deflector, and a sub-sub-deflector may be adopted.

Although an electromagnetic lens (magnetic field lens) is used as each of the illuminating lens 202, the projection lens 205 and the object lens 208, a part or all of those lenses may be electrostatic lenses. The focus correction lens 210 makes dynamic focus adjustment to height variation of the surface of the substrate 240, and an electrostatic lens is used as the focus correction lens 210. However, an electromagnetic lens (including a coil that generates an axisymmetric magnetic field) may be used. Alternatively, the focus correction lens 210 may be composed of a multiple-stage lens system in which each applied voltage and each exciting current change in coordination each other in a constant relationship. Alternatively, the object lens 208 may also include the function of the focus correction lens 210, or the object lens 208 and the focus correction lens 210 may be configured to make focus adjustment by working in coordination with each other in a constant relationship.

The fixed deflector 212 is disposed downstream of the positioning deflector 209 in the traveling direction of the electron beam B. That is, the fixed deflector 212 is disposed on the same side as the substrate 240 when viewed from (based on) the positioning deflector 209. The fixed deflector 212 is an electrostatic deflector. The focus correction lens 210 is disposed downstream of the fixed deflector 212 in the traveling direction of the electron beam B.

Figure 2:
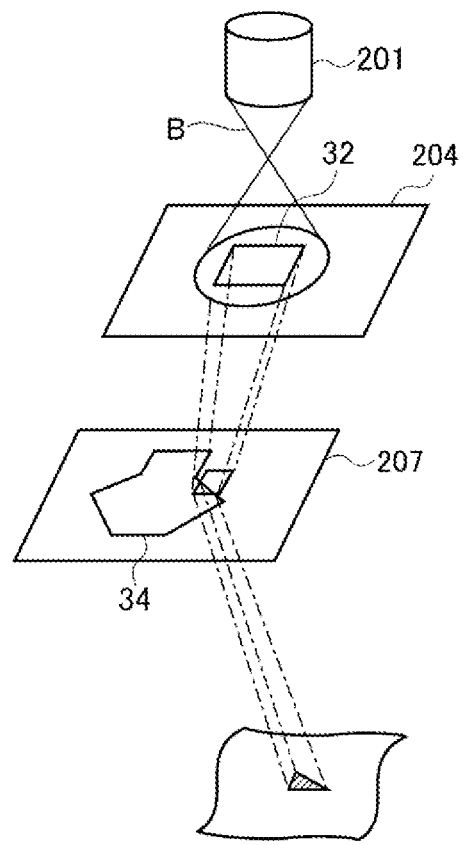
FIG. 2 is a perspective view of a first shaping aperture and a second shaping aperture.

FIG. 2 is a schematic view for explaining the beam shaping by the first shaping aperture member 204 and the second shaping aperture member 207. The first shaping aperture member 204 includes the rectangular opening 32 for shaping the electron beam B.

In addition, the second shaping aperture member 207 includes the variable shaping opening 34 for shaping the electron beam B into a desired shape, which has passed through the opening 32 of the first shaping aperture member 204. The beam profile, which has passed through both the opening 32 of the first shaping aperture member 204 and the variable shaping opening 34 of the second shaping aperture member 207, is written to a writing area of the substrate 240 placed on the XY stage 232 which moves continuously.

As illustrated in FIG. 1, the controller 100 has the control calculator 110, a deflection control circuit 120, a memory 130, a lens control circuit 140, and the detection circuit 150. In the memory 130, writing data that is layout data is input from the outside, and stored.

The control calculator 110 has a shot data generator 111 and a writing controller 112. Each component of the control calculator 110 may be composed of hardware such as an electric circuit or composed of software. When a component is composed of software, a program to implement at least part of the function of the control calculator 110 may be stored in a recording medium, and read into a computer including a CPU and executed by the computer. The recording medium is not limited to a removable recording medium, such as a magnetic disk and an optical disk, and may be a fixed recording medium, such as a hard disk drive and a memory.

The shot data generator 111 reads writing data from the memory 130, and generates shot data by performing multiple-stage data conversion process. The shot data includes information on shot shape, shot size, shot position, and shot time.

The writing controller 112 transfers shot data to the deflection control circuit 120 in the order of shots. The deflection control circuit 120 controls the amount of deflection of the blanker 203, the shaping deflector 206 and the positioning deflector 209 using the shot data, and performs a writing process.

In addition, the deflection control circuit 120 applies a constant (fixed) voltage to the fixed deflector 212 during a writing process.

The lens control circuit 140 controls each lens provided in the writer 200. For example, the lens control circuit 140 controls the amount of current to be applied to the coil of the object lens 208. In addition, the lens control circuit 140 controls the voltage to be applied to the focus correction lens 210 based on the surface height of the substrate 240, detected by the Z sensor 250.

Figure 3:
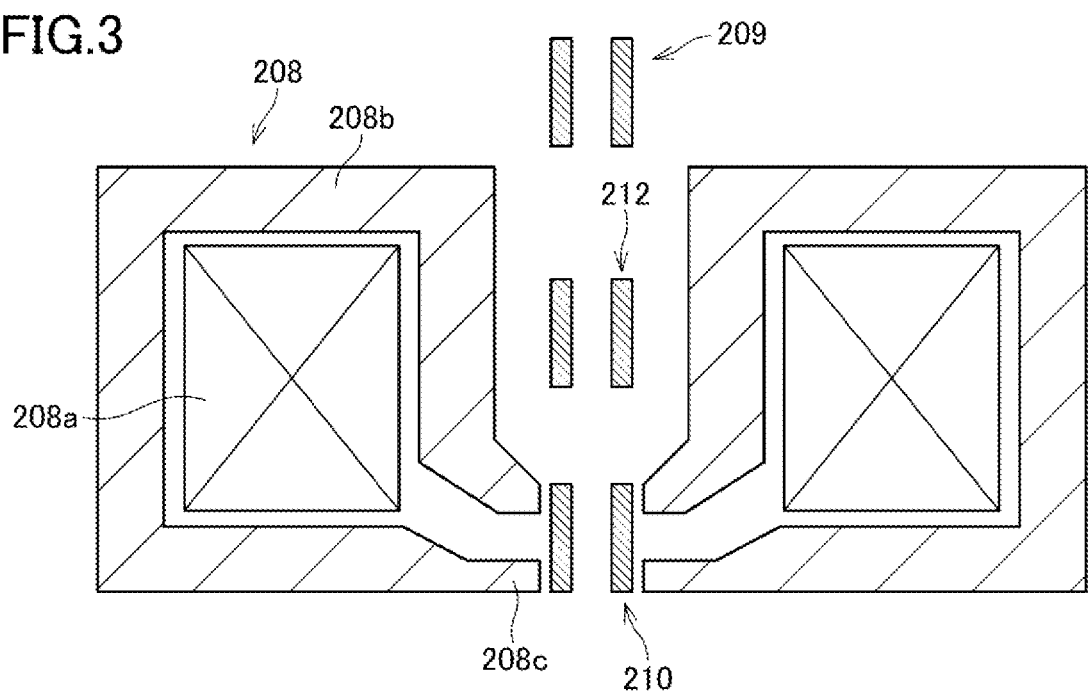
FIG. 3 is a sectional view of an object lens.

The object lens 208 is an electromagnetic lens, and has a coil 208a and a yoke 208b which stores the coil 208a as illustrated in FIG. 3. The yoke 208b is made of a material having high magnetic permeability, such as iron, and is provided with a cutout (pole piece 208c).

The magnetic field lines generated by a current flowing through the coil 208a escape to space through the pole piece 208c, and a magnetic field is generated.

The focus correction lens 210 is arranged, for example, inside the object lens 208 according to the height of the pole piece 208c, for example. The focus correction lens 210 is an electrostatic lens, and has a ring-shaped electrode. A positive voltage is applied to the electrode, and the focus correction lens 210 is operated in a positive voltage range. Thus, the secondary electrons are attracted to the electrode, and position variation due to charging of the resist can be reduced.

When the electron beam B (primary beam) is radiated to the substrate 240, secondary electrons are released from the substrate surface. The secondary electrons move upward in the electron optical column 220.

Figure 4A:
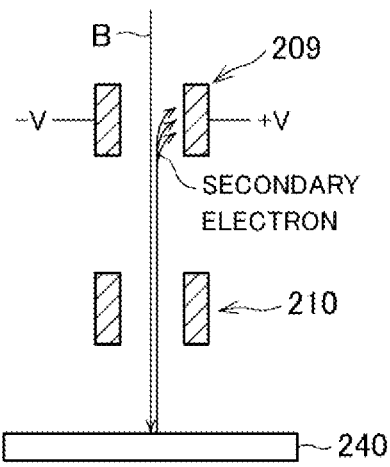
FIGS. 4A and 4B are each an explanatory view of the trajectory of a secondary electron according to a comparative example.

In a writing process, the resist on the surface of the substrate 240 is evaporated due to beam irradiation, and contamination (dirt) adheres to the electrode surface of the positioning deflector 209. When the fixed deflector 212 is not provided, as illustrated in FIG. 4A, the secondary electrons reach the contamination on the electrode surface of the positioning deflector 209, and cause the contamination to be charged, thereby altering the trajectory of the electron beam B.

Figure 4B:
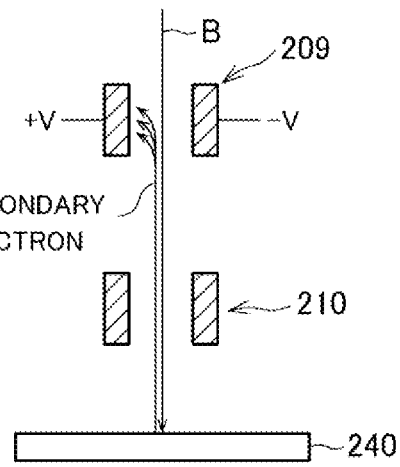

As illustrated in FIG. 4B, when a beam deflection position (beam irradiation position on the substrate 240) is altered by changing the voltage applied to the electrode of the positioning deflector 209, the intensity and direction of the electric field in the positioning deflector 209 are changed, and the reached position of the secondary electrons, in other words, the charged position is significantly changed across the electrode. Significant change in the charged position causes a substantial change in the electric field near the beam, and as a result, a large variation (drift) in the beam irradiation position occurs.

Figure 5A:
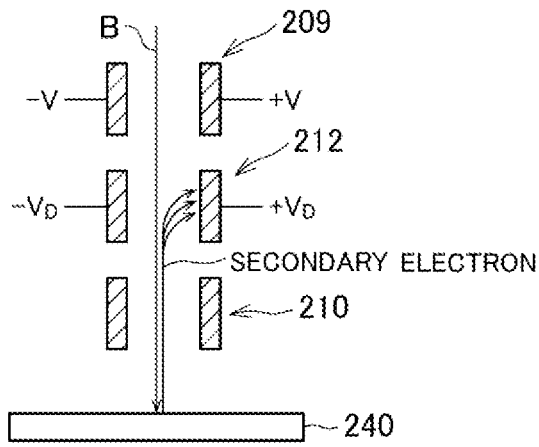
FIGS. 5A and 5B are each an explanatory view of the trajectory of a secondary electron according to the embodiment.

Thus, in the present embodiment, the fixed deflector 212 is installed between the focus correction lens 210 and the positioning deflector 209, and a fixed voltage is applied to the fixed deflector 212. Since the voltage applied to the fixed deflector 212 is not changed during a writing process, the amount of deflection caused by the fixed deflector 212 is fixed. As illustrated in FIG. 5A, the secondary electrons are deflected to the fixed deflector 212 in a transverse direction, and moved away from the vicinity of the trajectory of the electron beam B, thus most of the secondary electrons do not reach the positioning deflector 209.

Figure 5B:
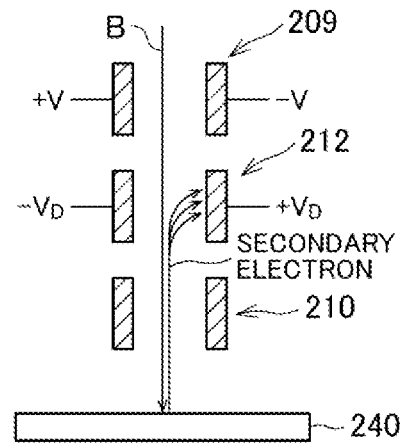

The secondary electrons deflected by the fixed deflector 212 reach the electrode of the fixed deflector 212, and the electrode is charged. As illustrated in FIG. 5B, even when the beam irradiation position is altered by changing the voltage applied to the positioning deflector 209, since the deflection voltage (deflection excitation) of the fixed deflector 212 is constant, there is no change in the reached position (the charged position) of the secondary electrons, and change in the electric field near the electron beam (that is, change in the electric field including its direction) is reduced, thus variation in the beam irradiation position is also reduced. Therefore, the accuracy of beam position can be improved.

In general, the energy (less than or equal to several tens eV) of the secondary electrons is extremely low as compared to the energy (approximately 50 kV) of the electron beam B for writing, thus even when the secondary electrons are deflected, the electron beam B is hardly deflected, and there is almost no effect on optical properties.

Figure 6:
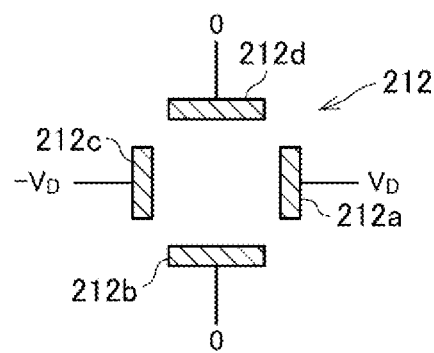
FIG. 6 is a view illustrating an example of voltages applied to a fixed deflector.

FIG. 6 is a view illustrating an example of voltages applied to the fixed deflector 212. As illustrated in FIG. 6, when the fixed deflector 212 is an electrostatic quadrupole deflector having four electrodes 212a to 212d, fixed deflection voltages $V_D$ and $-V_D$ are applied to a pair of opposed electrodes 212a and 212c, respectively, and the remaining electrodes 212b and 212d are fixed to the earth potential. In consideration of the specifications of the fixed deflector 212, the deflection voltages $V_D$ and $-V_D$ are determined by a numerical simulation. For example, the deflection voltage $V_D$ is 20 V or higher. The space surrounded by the four electrodes 212a to 212d is the region where the electron beam B passes.

Figure 7:
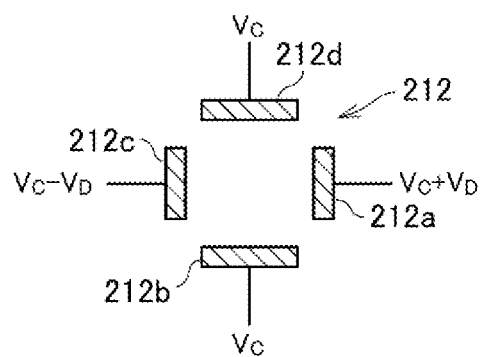
FIG. 7 is a view illustrating an example of voltages applied to the fixed deflector.

As illustrated in FIG. 7, a common positive voltage $V_C$ may be further added to the voltages respectively applied to the electrodes 212a to 212d. The common voltage $V_C$ has a value higher than or equal to an upper limit value of the voltage applied to the focus correction lens 210. During a writing process, a constant (fixed) value of the common voltage $V_C$ is applied from the deflection control circuit 120. Consequently, the secondary electrons which have passed through the focus correction lens 210 move to the fixed deflector 212 without being decelerated, thus it is possible to prevent staying of the secondary electrons between the focus correction lens 210 and the fixed deflector 212, and improve the position accuracy of the beam irradiation.

Figure 8A:
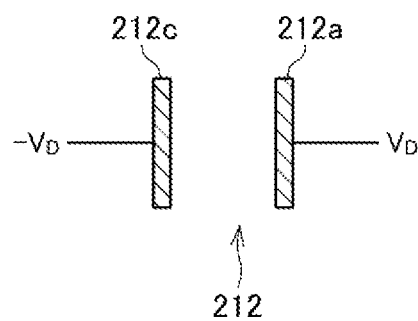
FIGS. 8A and 8B are each a view illustrating a configuration example of the fixed deflector.
Figure 8B:
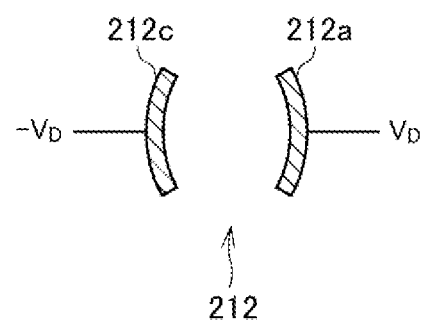

The fixed deflector 212 is not limited to a quadrupole deflector, and may be an octupole deflector. Alternatively, as illustrated in FIG. 8A, the fixed deflector 212 may be a bipolar deflector with the electrodes 212b and 212d removed. The pair of opposed electrodes 212a and 212c may have a flat board structure as illustrated in FIG. 8A, or the electrode surface facing a beam passing region may have a curved structure so as to be convex outwardly as illustrated in FIG. 8B.

Let $V_D$ be the voltage applied to the electrode 212a, and $-V_D$ be the voltage applied to the electrode 212c. When a common positive voltage $V_C$ is added to the applied voltages, the voltage applied to the electrode 212a is $V_C+V_D$, and the voltage applied to the electrode 212c is $V_C-V_D$. When $V_C=V_D$, the voltage applied to the electrode 212a is $2V_D$, and the voltage applied to the electrode 212c is 0, thus a power supply for applying a voltage to the electrode 212c is not necessary and the cost can be reduced.

In the embodiment above, an example has been described where one fixed deflector 212 is installed. However, multiple fixed deflectors may be installed. It is possible to reduce the distortion and aberration of the electron beam B (the primary beam for writing) by combining multiple fixed deflectors.

Figure 9:
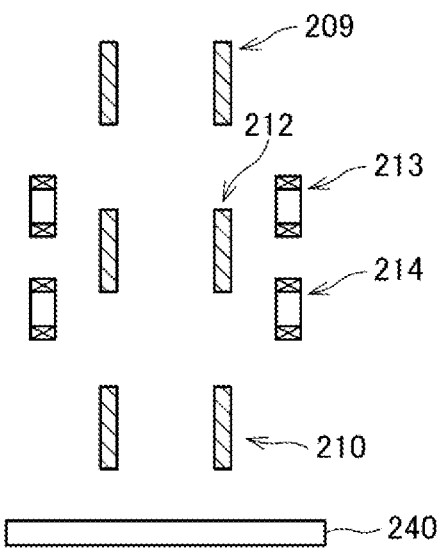
FIG. 9 is a view illustrating an example in which multiple fixed deflectors are disposed.

The multiple fixed deflectors may include both electrostatic deflectors and magnetic field deflectors. FIG. 9 illustrates an example of a configuration in which an electrostatic fixed deflector 212 and magnetic field fixed deflectors 213 and 214 are disposed.

Figure 10:
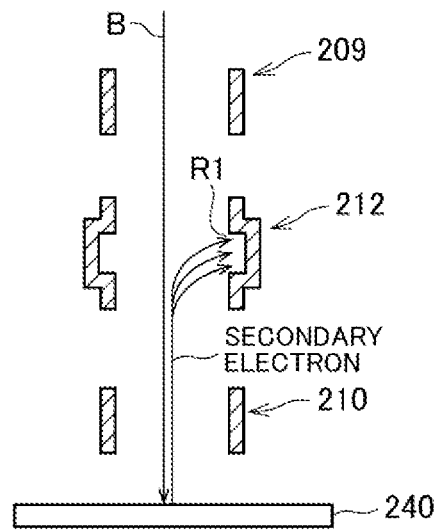
FIG. 10 is a schematic configuration view of a fixed deflector according to a modification.

As illustrated in FIG. 10, a recess R1 may be formed in the surface, facing the beam passing region, of the electrode of the fixed deflector 212. The area with which the secondary electrons collide is calculated by a simulation or the like of the trajectory of the secondary electrons, and the recess R1 is formed in the calculated area. The recess R1 may be formed in an electrode with which no secondary electrons collide.

When the recess R1 is formed, the bottom surface of the recess R1 serves as the charged position created by the secondary electrons, and as compared to when the recess R1 is not provided, the charged position deviates away from the trajectory of the electron beam B, and even when charging occurs, the deflection sensitivity of the beam is reduced. Thus, it is possible to further stabilize the beam. Consequently, the position accuracy of the beam irradiation can be improved.

Figure 11:
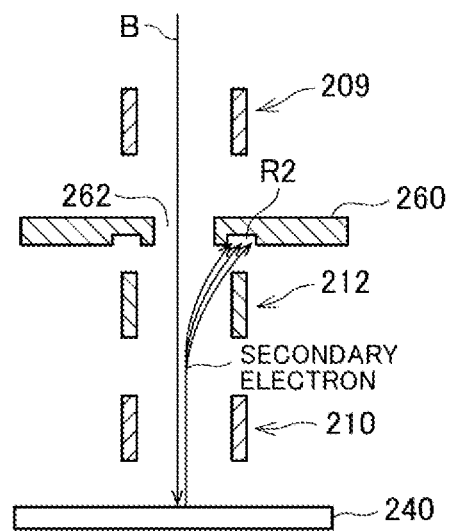
FIG. 11 is a view illustrating an example in which an aperture plate is disposed.

As illustrated in FIG. 11, an aperture plate 260 having a beam passing hole 262 may be provided between the positioning deflector 209 and the fixed deflector 212 to adjust the voltage applied to the fixed deflector 212 so that the secondary electrons collide with not the fixed deflector 212 but the aperture plate 260.

A recess R2 may be formed in the lower surface (the surface on the downstream side of the electron beam B) of the aperture plate 260. The area with which the secondary electrons collide is calculated by a simulation or the like of the trajectory of the secondary electrons, and the recess R2 is formed in the calculated area. The upper surface of the recess R2 serves as the charged position created by the secondary electrons, and as compared to when the recess R2 is not provided, the charged position deviates away from the trajectory of the electron beam B, and even when charging occurs, the deflection sensitivity of the beam is reduced. Thus, it is possible to further stabilize the beam. Consequently, the position accuracy of the beam irradiation can be improved.

The recess R2 may be formed in a circular shape to surround the beam passing hole 262, and may be formed only in part.

Reduction in the aberration and distortion may be aimed by increasing the inner diameter of the magnetic pole of the object lens 208 on the beam upstream side, and extending the distribution of lens focused magnetic field in the upstream direction. In this case, the lens focused magnetic field reaches the fixed deflector, thus the secondary electrons move in a direction perpendicular to the deflection electric field as illustrated in FIG. 12A and FIG. 12B. In other words, the secondary electrons move approximately parallel to the surfaces of the electrodes 212a and 212c which apply the deflection voltages $V_D$ and $-V_D$.

By setting the length L1 of the electrodes 212a and 212c longer than the length L2 of the electrodes 212b and 212d, the charged position created by the secondary electrons deviates away from the trajectory of the electron beam B, and the deflection sensitivity of the beam is reduced. Thus, it is possible to further stabilize the beam. Consequently, the position accuracy of the beam irradiation can be improved.

In the embodiment, the configuration has been described where the fixed deflector 212 is disposed between the focus correction lens 210 and the positioning deflector 209. However, as illustrated in FIG. 13, the fixed deflector 212 may be disposed between the focus correction lens 210 and the substrate 240 (on the beam downstream side of the focus correction lens 210).

Figure 15:
FIG. 15 is a sectional view taken along XV-XV line of FIG. 14.

When the distance between the substrate 240 and the focus correction lens 210 is short, the electrode of the fixed deflector 212 may have a divided ring shape obtained by dividing a thin plate-shaped ring as illustrated in FIG. 14 and FIG. 15.

Figure 16:
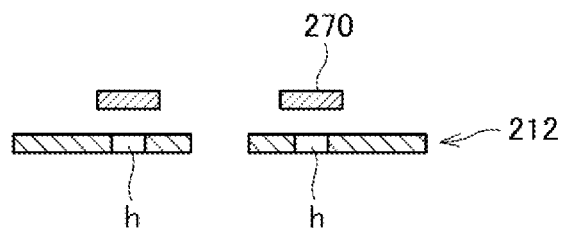
FIG. 16 is a view illustrating a configuration in which an electron detector is disposed above the fixed deflector.

As illustrated in FIG. 16, in a divided ring-shaped electrode, an opening h may be formed through which electrons reflected on the substrate 240 pass, and an electron detector 270 for detecting a mark position may be disposed above the opening h.

In the embodiment, the configuration has been described where an electron beam is used as an example of a charged particle beam. However, the charged particle beam is not limited to an electron beam, and may be a beam using a charged particle beam, such as an ion beam.

In the embodiment, the configuration in which a single beam is used has been described. However, the configuration in which a multi-beam is used may be adopted.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A charged particle beam writing apparatus comprising:
a positioning deflector adjusting an irradiation position of a charged particle beam radiated to a substrate which is a writing target;
a fixed deflector which is disposed downstream of the positioning deflector in a traveling direction of the charged particle beam, and in which an amount of deflection is fixed;
a focus correction lens performing focus correction on the charged particle beam according to a surface height of the substrate; and
an object lens focusing the charged particle beam.

2. The apparatus according to claim 1,
wherein the focus correction lens is an electrostatic lens, and is operated in a positive voltage range with respect to a surface of the substrate.

3. The apparatus according to claim 1,
wherein the fixed deflector includes an electrostatic deflector, and a common positive voltage with respect to the surface of the substrate is added to a voltage applied to each of a plurality of electrodes included in the electrostatic deflector.

4. The apparatus according to claim 3,
wherein the focus correction lens is an electrostatic lens, and the common positive voltage is higher than or equal to a voltage applied to the focus correction lens.

5. The apparatus according to claim 4,
wherein a voltage twice as high as the common voltage is applied to one of a pair of opposed electrodes among the plurality of electrodes, and a voltage applied to an other electrode is zero.

6. The apparatus according to claim 1,
wherein the focus correction lens is disposed downstream of the positioning deflector in the traveling direction of the charged particle beam.

7. The apparatus according to claim 6,
wherein the fixed deflector is disposed downstream of the focus correction lens in the traveling direction of the charged particle beam.

8. The apparatus according to claim 6,
wherein the fixed deflector is disposed upstream of the focus correction lens in the traveling direction of the charged particle beam.

9. The apparatus according to claim 1,
wherein the fixed deflector is composed of deflectors in multiple stages.

10. The apparatus according to claim 9,
wherein the fixed deflector includes an electrostatic deflector and a magnetic field deflector.

11. The apparatus according to claim 1,
wherein the fixed deflector includes an electrostatic deflector, and a recess is provided in a surface of at least one of a plurality of electrodes included in the electrostatic deflector, the surface facing a beam passing region.

12. The apparatus according to claim 1, further comprising
an aperture plate provided between the positioning deflector and the fixed deflector.

13. The apparatus according to claim 12,
wherein a recess is provided in a surface of the aperture plate, the surface being downstream in the traveling direction of the charged particle beam.

* * * * *